(12) United States Patent
Yokobori et al.

(10) Patent No.: US 7,969,068 B2
(45) Date of Patent: Jun. 28, 2011

(54) ULTRASONIC TRANSDUCER WITH A RETRACTED PORTION ON A SIDE SURFACE OF THE PIEZOELECTRIC LAYER

(75) Inventors: Yoichi Yokobori, Ueda (JP); Hiroyuki Yagami, Ashigarakami-gun (JP)

(73) Assignees: Ueda Japan Radio Co., Ltd., Ueda-Shi, Nagano (JP); Terumo Kabushiki Kaisha, Shibuya-Ku, Tokyo (JP)

( * ) Notice: Subject to any disclaimer, the term of this patent is extended or adjusted under 35 U.S.C. 154(b) by 312 days.

(21) Appl. No.: 12/339,828

(22) Filed: Dec. 19, 2008

(65) Prior Publication Data

US 2009/0160293 A1    Jun. 25, 2009

(30) Foreign Application Priority Data

Dec. 19, 2007   (JP) .................................. 2007-327778
Dec. 19, 2007   (JP) .................................. 2007-327779

(51) Int. Cl.
*H01L 41/08*    (2006.01)
*H04R 17/00*   (2006.01)

(52) U.S. Cl. .......................... 310/334; 600/459; 310/365
(58) Field of Classification Search .................. 310/334, 310/365; 600/457, 459
See application file for complete search history.

(56) References Cited

U.S. PATENT DOCUMENTS

| | | | | |
|---|---|---|---|---|
| 4,385,255 A * | 5/1983 | Yamaguchi et al. | .......... | 600/459 |
| 5,122,993 A * | 6/1992 | Hikita et al. | .................. | 600/459 |
| 5,855,049 A * | 1/1999 | Corbett et al. | ................ | 310/334 |
| 6,558,332 B1 * | 5/2003 | Shimizu | ........................ | 600/459 |
| 6,744,178 B2 * | 6/2004 | Muramatsu et al. | .......... | 310/334 |

* cited by examiner

*Primary Examiner* — J. SanMartin
(74) *Attorney, Agent, or Firm* — Buchanan Ingersoll & Rooney PC (57) ABSTRACT

An ultrasonic transducer has a rectangular piezo-electric ceramic sheet piece 2 which has a retracted portion 1 on a side face, an upper electrode layer 3 placed on an upper surface of the ceramic sheet piece, 4 a first terminal electrode that is placed on the upper surface of the ceramic sheet piece and connected to the upper electrode layer 3, a lower electrode layer 5 placed on the lower surface of the ceramic sheet piece, an electro-conductive layer 6 that is placed on the retracted side face 1 and connected to the lower electrode layer 5, a second terminal electrode 7 that is placed on the upper surface of the ceramic sheet piece and is connected to the electro-conductive layer 6, a first lead wire 9a connected to the first terminal electrode, a second lead wire 9b connected to the second terminal electrode 7, an acoustic matching layer 10 placed on the upper electrode layer, and an acoustic absorbing layer 11 placed on the surface of the lower electrode layer.

4 Claims, 8 Drawing Sheets

ULTRASONIC TRANSDUCER WITH A RETRACTED PORTION ON A SIDE SURFACE OF THE PIEZOELECTRIC LAYER

FIELD OF THE INVENTION

The present invention relates to an ultrasonic transducer, particularly, an extremely small sized ultrasonic transducer which is favorably attached to a catheter.

BACKGROUND OF THE INVENTION

The ultrasonic transducer is utilized as an ultrasonic transmitting-receiving unit for ultrasonic diagnostic apparatus. Recently, the ultrasonic transducer sometimes is attached to a catheter and ultrasonic diagnostic procedure is performed under such condition that the catheter is placed in a human body. In consideration of burden applied to the body, the ultrasonic transducer attached to the catheter should be miniaturized. The miniaturization of the ultrasonic transducer is also required in the case that the probe element is inserted into vascular tracts or narrow body cavities.

Generally, the ultrasonic transducer comprises a thin piezoelectric ceramic sheet piece having a smooth surface on upper and lower sides and a pair of electrode layers each of which is placed on each of the upper and lower side surfaces. On a surface of one electrode layer on which ultrasonic wave is transmitted and received is placed an acoustic matching layer which serves to increase wave-transmission efficiency. On a surface of another electrode layer is placed an acoustic absorbing layer which serves to absorb noise of ultrasonic wave. Generally, both of the acoustic matching layer and acoustic absorbing layer are made of non-electroconductive polymer material. For the known ultrasonic transducer having the above-mentioned structure, it is not easy to connect the upper and lower electrode layers to an outer electric source.

In order to facilitate the connection of the electrode layers to an outer electric source, there has been proposed to extend one of the electrode layers to the side of another (i.e., opposite) electrode layer so that the connections of both electrode layers to an outer electric source can be made on one surface side of the probe element. Generally, an electrode layer extended to the side of the opposite electrode layer is called "turn-up electrode" or "turn-down electrode".

Japanese Patent Provisional Publication (JPA) 8-280095 discloses an ultrasonic transducer having a turn-down electrode layer which is extended to the bottom surface of the piezoelectric ceramic sheet piece along the side face of the ceramic sheet piece.

Japanese Patent Provisional Publication (JPA) 2001-292495 discloses an ultrasonic transducer having a turn-up electrode layer which is extended to an opposite surface of the piezoelectric ceramic sheet piece along the side faces of the ceramic sheet piece.

As is described above, the use of the turn-up electrode layer or turn-down electrode layer is advantageous for facilitating connection of electrode layers of an ultrasonic transducer to lead wires. However, it is not easy to form the turn-up electrode or turn-down electrode on a highly miniaturized ultrasonic transducer. For example, it is now required to provide such a highly miniaturized ultrasonic transducer as having a size of 1 mm or less which is required for mounting the probe element to a catheter for vascular tracts. However, it is not easy to form the turn-up electrode or turn-down electrode on the highly miniaturized ultrasonic transducer in industrially applicable processes.

SUMMARY OF THE INVENTION

It is an object of the present invention to provide an ultrasonic transducer having a turn-up electrode or a turn-down electrode which can be manufactured in such a very small size as favorably mountable to a catheter in an industrially applicable process.

According to one aspect, there is provided an ultrasonic transducer comprising a rectangular piezoelectric ceramic sheet piece which has a partly retracted portion on a side face, an upper electrode layer placed on an upper surface of the ceramic sheet piece, a first terminal electrode that is placed on the upper surface of the ceramic sheet piece and electrically connected to the upper electrode layer, a lower electrode layer placed on the lower surface of the ceramic sheet piece, an electro-conductive layer that is placed on the retracted side face and electrically connected to the lower electrode layer, a second terminal electrode that is placed on the upper surface of the ceramic sheet piece and is electrically connected to the electro-conductive layer, a first lead wire electrically connected to the first terminal electrode, a second lead wire electrically connected to the second terminal electrode, an acoustic matching layer placed on the upper electrode layer, and an acoustic absorbing layer placed on the surface of the lower electrode layer.

According to an additional aspect, the acoustic absorbing layer can be extended beyond the rear side of the ceramic sheet piece to provide an extended layer and the first and second lead wires can be intermediately fixed onto the extended layer.

According to another aspect, the ultrasonic transducer can be manufactured by an process which comprises the steps of:

1) providing a piezoelectric ceramic sheet which has through-holes aligned on the sheet;

2) placing a lower electrode layer on a lower surface of the ceramic sheet around each of lower openings of the through-holes and placing an electro-conductive layer on an inner face of each of the through-holes;

3) placing a second terminal electrode on an upper surface of the ceramic sheet around each of upper openings of the through-holes, another electro-conductive layer on an inner face of each of the through-holes to electrically connect it to the electro-conductive layer placed in the through-holes in the step 2), an upper electrode layer on the upper surface of the ceramic sheet in an area facing the lower electrode layer, and a first terminal electrode on the upper surface of the ceramic sheet, in which the first terminal electrode is electrically connected to the upper electrode layer under such condition that both of the upper electrode layer and the first terminal electrode are electrically kept off the second terminal electrode;

4) placing an acoustic matching layer on the upper electrode layer;

5) placing an acoustic absorbing layer on the lower electrode layer;

6) cutting the ceramic sheet at least subjected to the steps 2) and 3 in such manner that the ceramic sheet is divided along an imaginary line connecting the through-holes and each of divided portions has an upper electrode, an upper terminal electrode, a lower electrode layer and a lower terminal electrode, and 7) attaching a first lead wire to the first terminal electrode and a second lead wire to the second terminal electrode, in which step 3) can be performed in advance of step 2); step 5) can be performed in advance of step 4); and step 4) and step 5) can be performed between step 6) and step 7).

DETAILED DESCRIPTION OF THE INVENTION

The ultrasonic transducer and a process of manufacturing the ultrasonic transducer are hereinbelow described in more detail by referring to the attached drawings.

Figure 1:
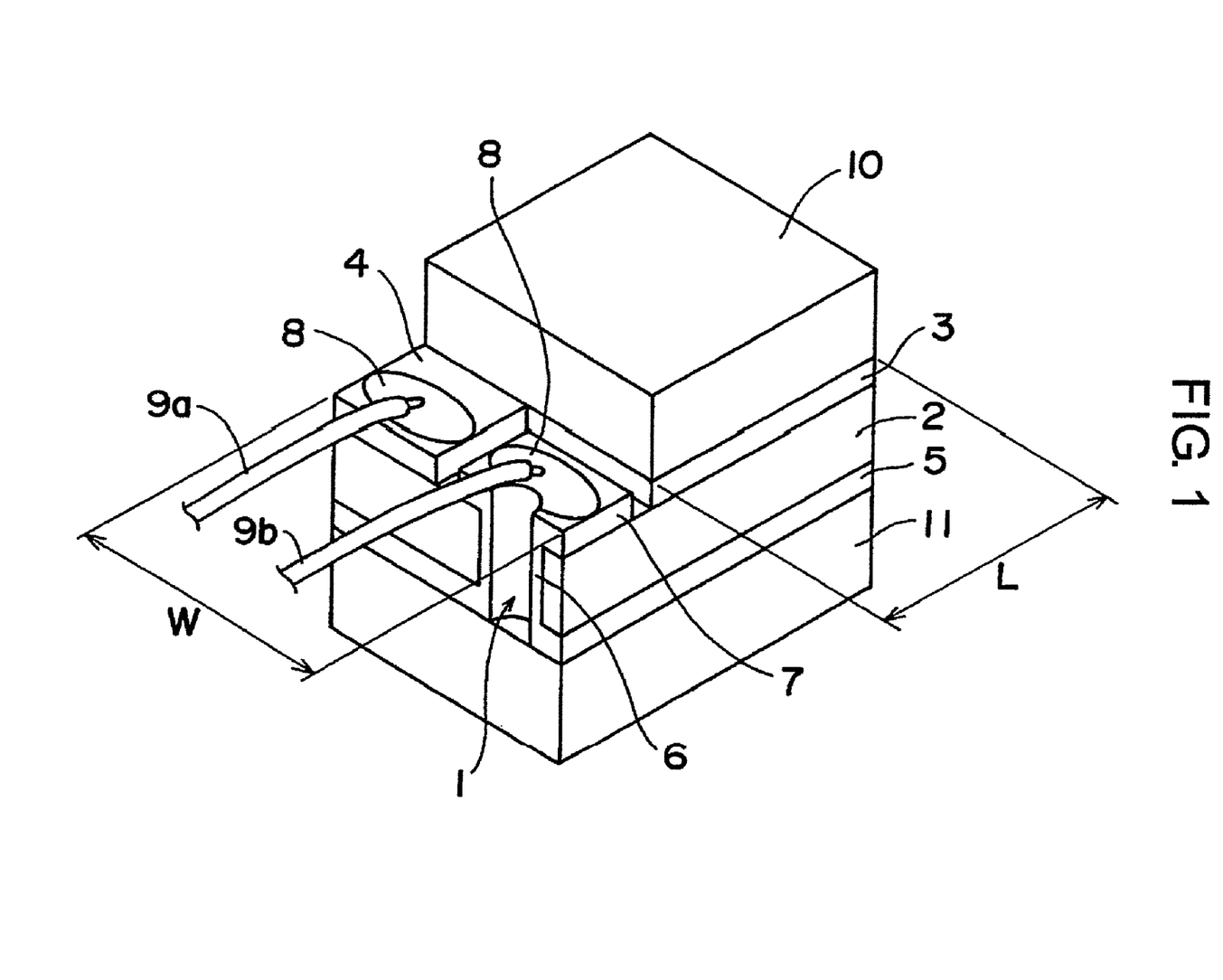
FIG. 1 is a schematic view of an embodiment of an ultrasonic transducer according to the invention.

FIG. 1 is a schematic view of an embodiment of an ultrasonic transducer according to the invention. In FIG. 1, the ultrasonic transducer comprises a rectangular piezoelectric ceramic sheet piece 2 which has a retracted portion 1 on a side face extended in the thickness direction, an upper electrode layer 3 placed on an upper surface of the ceramic sheet piece 2, a first terminal electrode 4 that is placed on the upper surface of the ceramic sheet piece 2 and electrically connected to the upper electrode layer 3, a lower electrode layer 5 placed on the lower surface of the ceramic sheet piece 2, an electro-conductive layer 6 that is placed on the retracted portion 1 and electrically connected to the lower electrode layer 5, a second terminal electrode 7 that is placed on the upper surface of the ceramic sheet piece 2 and is electrically connected to the electro-conductive layer 6, a first lead wire 9a electrically connected to the first terminal electrode 4, a second lead wire 9b electrically connected to the second terminal electrode 7, an acoustic matching layer 10 placed on the upper electrode layer 3, and an acoustic absorbing layer 11 placed on the surface of the lower electrode layer 5.

In the ultrasonic transducer, a combination of the electro-conductive layer 6 and the second terminal electrode 7 forms a turn-up electrode which is extended to the upper surface of the piezoelectric ceramic sheet piece 2 from the lower electrode layer 5.

The retracted portion 1 which is formed on the side face (i.e., rear side face) of the piezoelectric ceramic sheet piece 2 preferably in the form having a semi-circular curve but may be in the form having a rigid curve. The retracted portion 1 can be formed near the center of the second terminal electrode 7 for the lower electrode layer 5 but is preferably formed apart from the center of the second terminal electrode 7 so that a lead wire 9b is easily connected to the second terminal electrode 7.

The piezoelectric ceramic sheet piece 2 is preferably made of piezoelectric ceramic material such as piezoelectric zirconate titanate (PZT) or lithium niobate.

The upper electrode layer 3 serves as a surface for transmitting and receiving ultrasonic wave. A ratio of the width (W) to the length (L) of the upper electrode layer 3 preferably is in the range of 0.8/1.0 to 1.0/0.8 in terms of W/L.

The first terminal electrode 4 and the second terminal electrode 7 can be arranged on both sides of the upper electrode layer 3. However, it is preferred that the first terminal electrode 4 and the second terminal electrode 7 are arranged adjacently to each other in an area near to the retracted portion 1.

The upper electrode layer 3, first terminal electrode 4, lower electrode layer 5, electro-conductive layer 6 and second terminal electrode 7 can be made of electro-conductive metallic material such as silvers chromium, copper, nickel or gold. The electro-conductive metallic material can be placed in a laminated form.

The electro-conductive fixing material layer 8 used for fixing the lead wires 9a, 9b to the electrode layers 4, 7 can be made of solder or an electro-conductive binder. Otherwise, the lead wires 9a, 9b can be connected to the electrode layers 4, 7 by welding. Alternatively, the lead wires 9a, 9b can be connected to the electrode layers 4, 7 by wire bonding.

The acoustic matching layer 10 may be made of resinous material such as epoxy resin. The acoustic matching layer 10 can be composed of two or more layers.

The acoustic absorbing layer 11 may be made of elastic material such as rubber or epoxy resin in which metallic powder such as tungsten powder is dispersed.

The ultrasonic transducer can be manufactured by the aforementioned process comprising the aforementioned seven steps of steps 1) to 7).

The manufacturing process is described hereinbelow by referring to FIG. 2 to 8 in the attached drawings.

Figure 2:
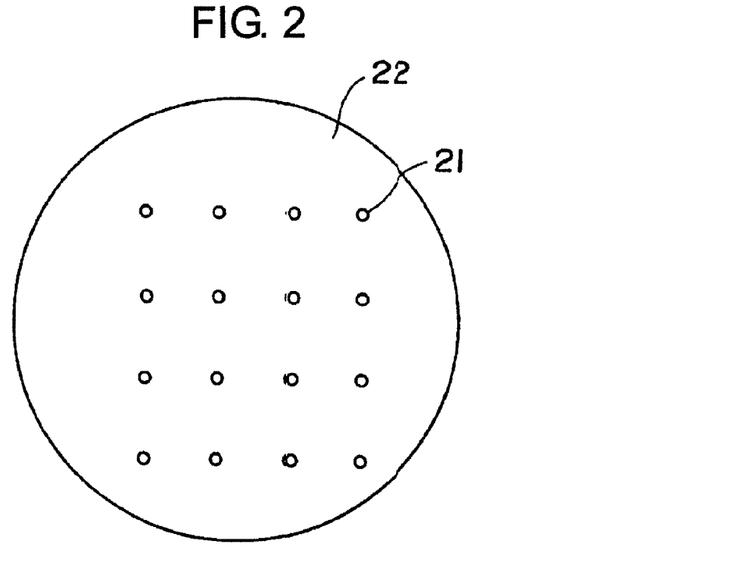
FIG. 2 is a plan view of an embodiment of a piezoelectric ceramic sheet having through-holes aligned on the sheet which is favorably employable for manufacturing an ultrasonic transducer according to the invention.

FIG. 2 is a plan view of a piezoelectric ceramic sheet 22 having through-holes 21 aligned on the sheet which is provided in the step 1). In FIG. 2, the piezoelectric ceramic sheet 22 is a circular sheet on which sixteen (4×4) through-holes 21 are aligned in X-Y directions. One through-hole is used for manufacturing one ultrasonic transducer. There are no specific limitation with respect to number of the through-holes in one piezoelectric ceramic sheet. Generally 2 to 1,000 through-holes, preferably 10 to 500 through-holes, are formed in one piezoelectric ceramic sheet.

The piezoelectric ceramic sheet preferably has a thickness in the range of 0.010 to 0.20 mm, more preferably 0.020 to 0.10 mm. The inner diameter of the through-hole is preferably in the range of 0.010 to 0.40 mm, more preferably in the range of 0.020 to 0.20 mm. An aspect ratio of the through-hole, that is, thickness of ceramic sheet/inner diameter of through-hole, is preferably in the range of 0.1 to 1.0, more preferably in the range of 0.2 to 0.8.

The piezoelectric ceramic sheet 22 having the through-holes 21 can by prepared, for example, by drilling or punching a thin piezoelectric ceramic sheet having a predetermined thickness or by a combination of drilling or punching a piezoelectric ceramic sheet having a large thickness and grinding both surfaces of the drilled or punched ceramic sheet to give a piezoelectric ceramic sheet having through-holes and the predetermined thickness. The latter process is more favorably employed.

Figure 3:
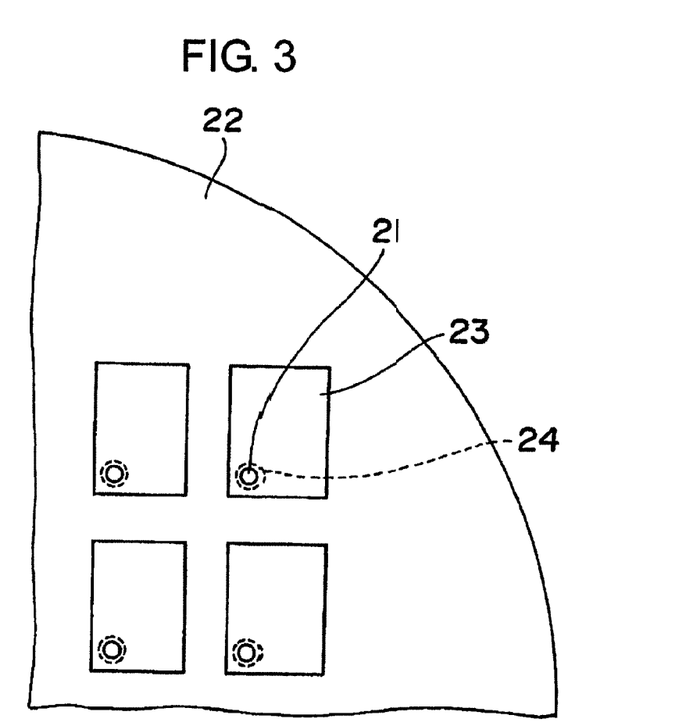
FIG. 3 is an enlarged plan view of a back surface of the piezoelectric ceramic sheet of FIG. 2 on which a lower electrode layer is placed and in the through-holes of which an electro-conductive layer is formed.

FIG. 3 is an enlarged plan view of a back surface of the piezoelectric ceramic sheet 22 on which a lower electrode layer 23 is placed and in the through-holes of which an electro-conductive layer 24 is formed by the step 2). In FIG. 3, one lower electrode layer 23 is placed around one through-hole 21. The lower electrode layer can be placed in the form of a strip of electrode material. Otherwise, the lower electrode layer can be placed on the whole back surface of the piezoelectric ceramic sheet.

Figure 4:
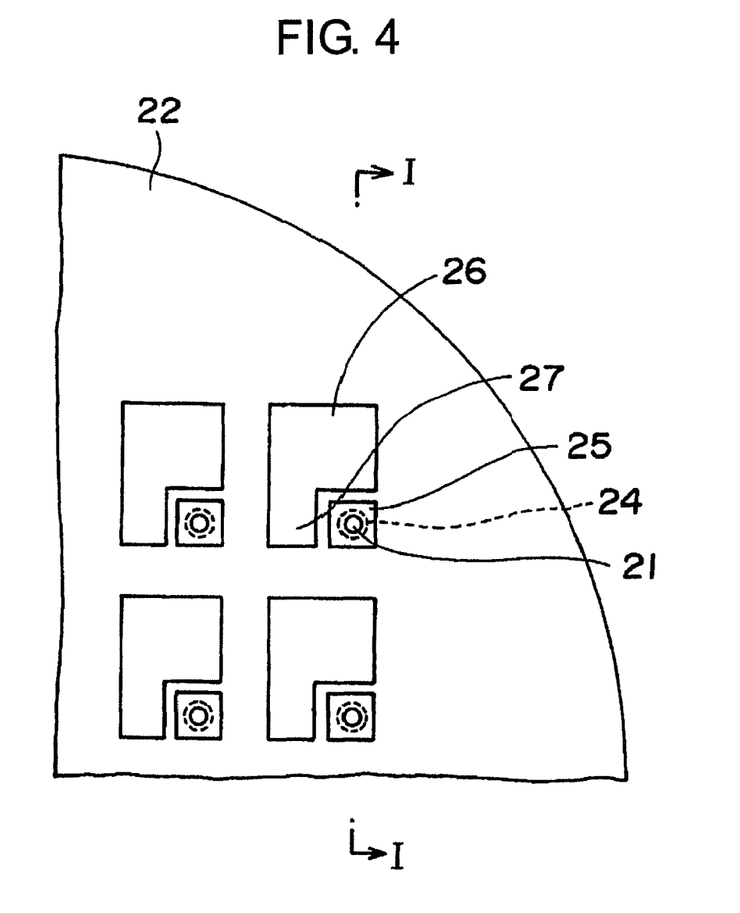
FIG. 4 is an enlarged plan view of a front surface of the piezoelectric ceramic sheet of FIG. 3 on which an upper electrode layer, a first terminal electrode for the upper electrode layer, and a second terminal electrode for the lower electrode layer are placed and in the through-holes of which an electro-conductive layer is formed.
Figure 5:
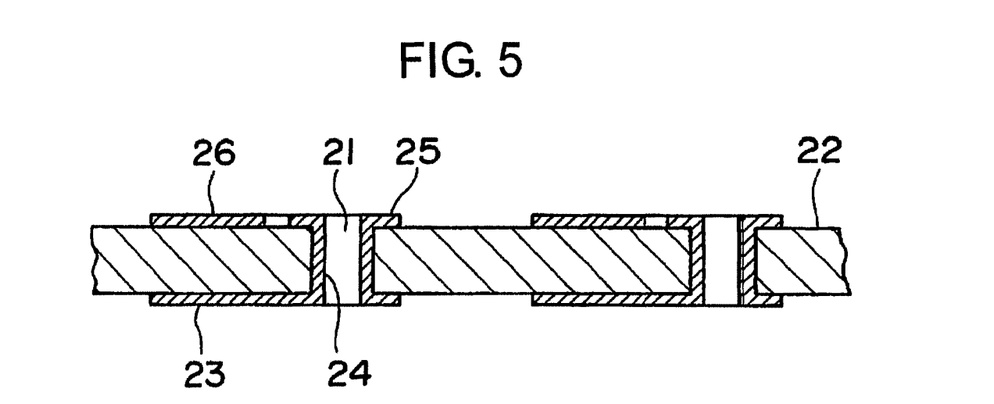
FIG. 5 is a section view taken along I-I line of FIG. 4.

FIG. 4 is an enlarged plan view of a front surface of the piezoelectric ceramic sheet 22 on which an upper electrode layer 24, a first terminal electrode for the upper electrode layer 27, and a second terminal electrode 25 for the lower electrode layer are placed, which is prepared in the step 3). FIG. 5 is a section view taken along I-I line of FIG. 4.

In the manufacturing process, the lower electrode layer 23, electro-conductive layer 24 and second terminal electrode 25 are united in series to form an electro-conductive structure by placing the lower electrode layer 23 and a lower part of the electro-conductive layer 24 in the step 2) and then placing an upper part of the electro-conductive layer 24 in the step 3). Further, the upper electrode layer 26 and first terminal electrode 27 are placed in the step 3) to form a united structure comprising the upper electrode layer 26 and first terminal layer 27.

In the manufacturing process of the invention, the step 3) can be performed in advance of the step 2).

Each of the patterned electrodes or electrode layers can be placed on the ceramic sheet by known methods using a mask, such as ion-plating, vapor deposition or sputtering.

Figure 6:
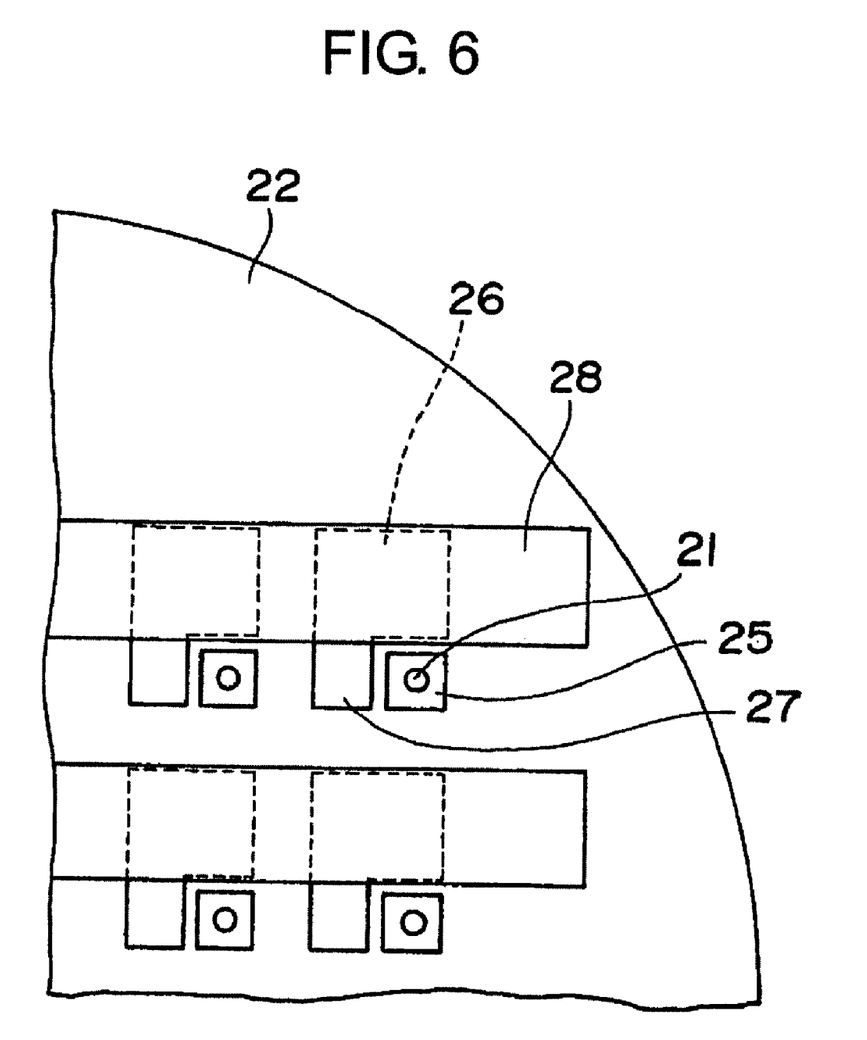
FIG. 6 is an enlarged plan view of a front surface of the piezoelectric ceramic sheet of FIG. 4 on which an acoustic matching layer is placed.

FIG. 6 is an enlarged plan view of a front surface of the piezoelectric ceramic sheet 22 of FIG. 4 on which an acoustic matching layer 28 is placed in the step 4). In FIG. 6, the acoustic matching layer is in the form of a strip extended laterally which is placed over a series of the plural upper electrode layers 22. However, the acoustic matching layer can be divided so that one acoustic matching layer is placed on one upper electrode layer. Otherwise, an acoustic matching layer can be placed over the whole surface of the piezoelectric ceramic sheet except the areas in which the first terminal electrodes 27 and second terminal electrodes 25 are placed.

The acoustic matching layer 28 can be placed on the upper electrode layer 22 by a process of laminating a resinous sheet of acoustic matching material or a process comprising the steps of coating a liquid containing resinous acoustic matching material and curing the resinous material.

Figure 7:
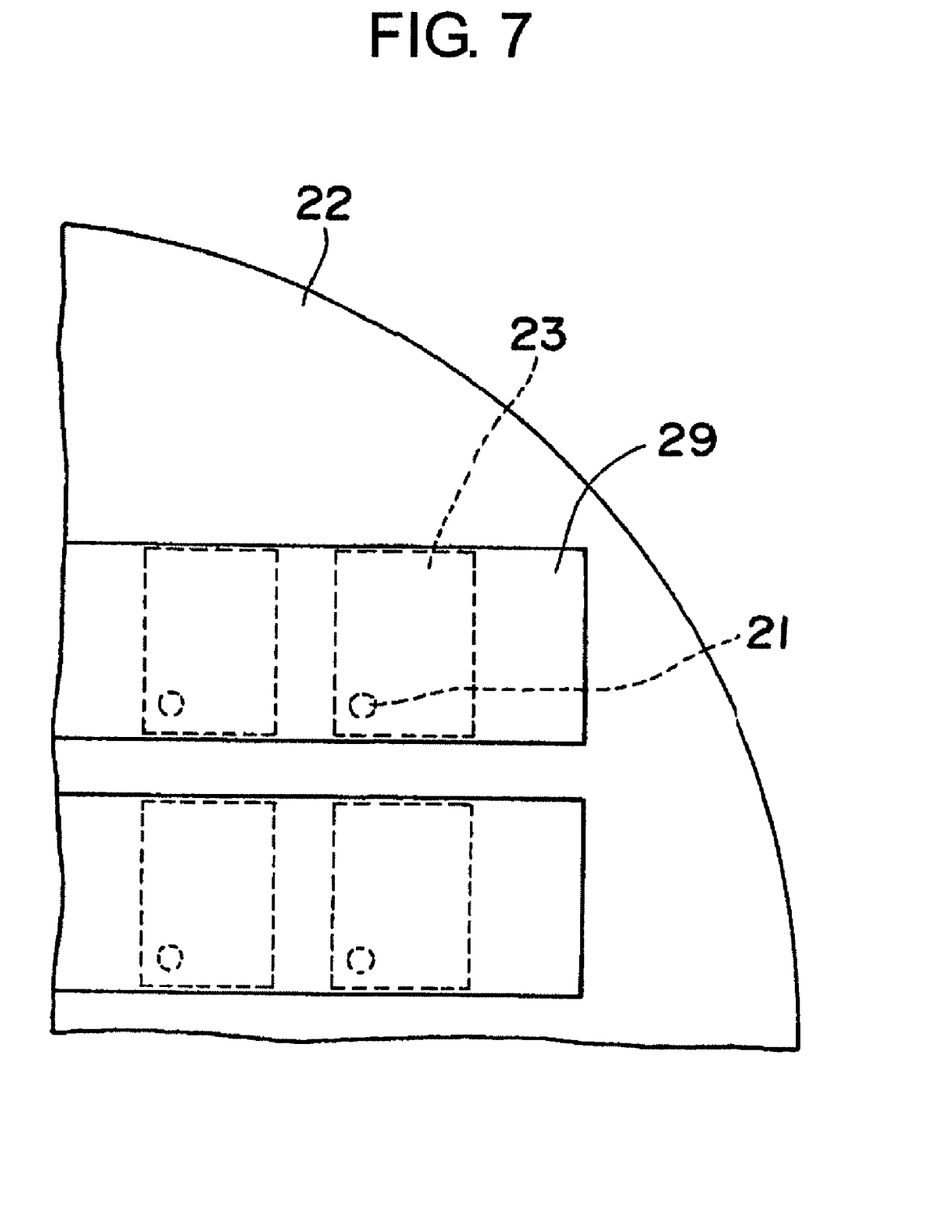
FIG. 7 is an enlarged plan view of a back surface of the piezoelectric ceramic sheet of FIG. 6 on which an acoustic absorbing layer is placed.

FIG. 7 is an enlarged plan view of a back surface of the piezoelectric ceramic sheet of FIG. 6 on which an acoustic absorbing layer 29 is placed in the step 5). In FIG. 7, the acoustic absorbing layer 29 is in the form of a strip extended laterally which is placed over a series of the plural lower electrode layers 23. However, the acoustic absorbing layer can be divided so that one acoustic absorbing layer is placed on one lower electrode layer. Otherwise, an acoustic absorbing layer can be placed over the whole surface of the piezoelectric ceramic sheet.

The acoustic absorbing layer 29 can be placed on the lower electrode layer 23 by a process of laminating a resinous sheet of acoustic absorbing material or a process comprising the steps of coating a liquid containing resinous acoustic absorbing material and curing the resinous material.

Onto each of the first and second terminal electrodes 25, 27, are attached each one end of lead wires using electro-conductive fixing material. The electro-conductive material can be placed on the terminal electrode between the step 4) for placement of the acoustic matching layer 28 and the step 6) for cutting the piezoelectric sheet.

Figure 8:
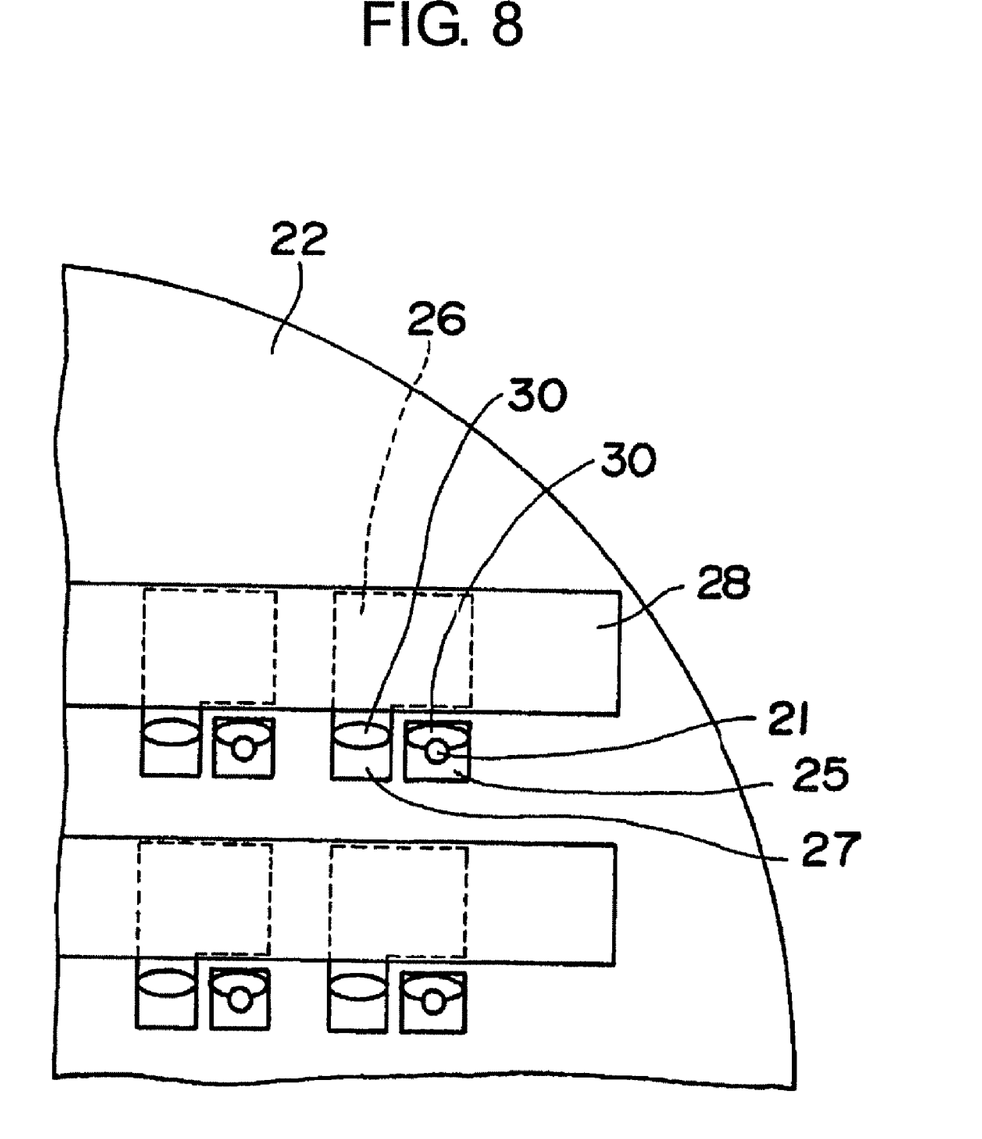
FIG. 8 is an enlarged plan view of a front surface of the piezoelectric ceramic sheet of FIG. 7 on each of the first and second terminal electrodes of which an electro-conductive fixing material layer is placed.

FIG. 8 is an enlarged plan view of a front surface of the piezoelectric ceramic sheet on each of the first terminal electrode 27 and the second terminal electrode 25 of which an electro-conductive fixing material layer 30 is placed. The electro-conductive fixing material layer can be placed in advance of the step 5) for placement of the acoustic absorbing layer.

Figure 9:
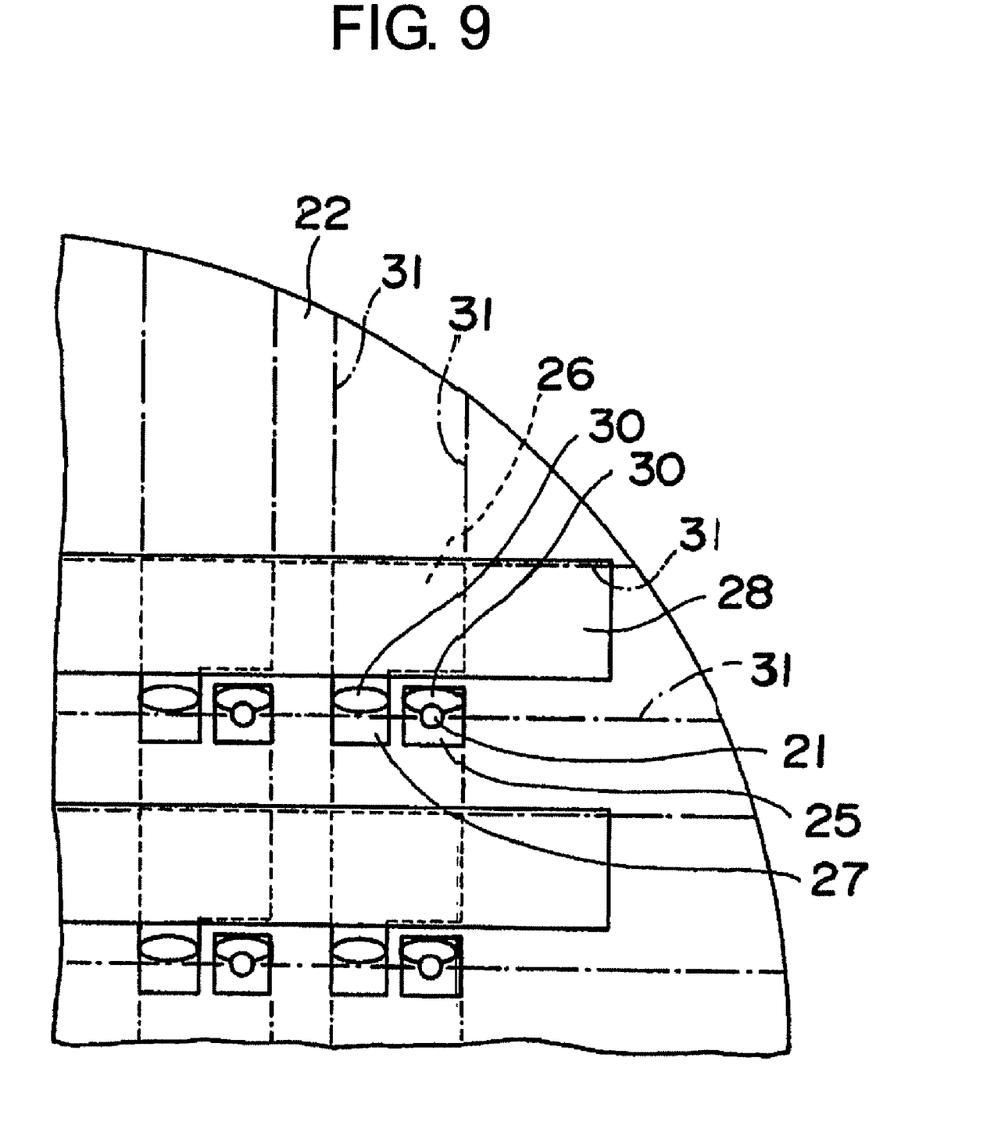
FIG. 9 is an enlarged plan view of a front surface of the piezoelectric ceramic sheet of FIG. 8 on which cutting lines are shown.

FIG. 9 is an enlarged plan view of a front surface of the piezoelectric ceramic sheet 22 on which cutting lines 31 are shown. In the manufacturing process, the piezoelectric ceramic sheet 22 is cut on the cutting lines 31 extending over a series of the through-holes 21, whereby the partly retracted side surface covered with an electro-conductive layer is produced on a side face of the divided piezoelectric ceramic sheet, i.e., piezoelectric ceramic sheet piece. In more detail, the upper electrode layer 27 and lower electrode layer 25 are sectioned when the through-hole 21 is sectioned, whereby a structure of a small sized ultrasonic transducer is manufactured.

Subsequently, each of a pair of lead wires are attached to the first terminal electrode and second terminal electrode using the electro-conductive fixing material, to give an ultrasonic transducer illustrated in FIG. 1.

In the manufacturing process, the steps 4) to 6) can be performed in optionally selected order. For instance, the placement of acoustic matching layer and the placement of acoustic absorbing layer can be performed in an order differing from the aforementioned order. That is the order of the step 5)-step 4)-step 6). Otherwise the piezoelectric sheet can be cut after placement of the acoustic matching layer and then the acoustic absorbing layer can be placed. That is the order of the step 4)-step 6)-step 5). Alternatively, the piezoelectric sheet can be first cut and the acoustic matching layer and acoustic absorbing layer are placed afterwards. That is the order of the step 6)-step 4)-step 5).

Figure 10:
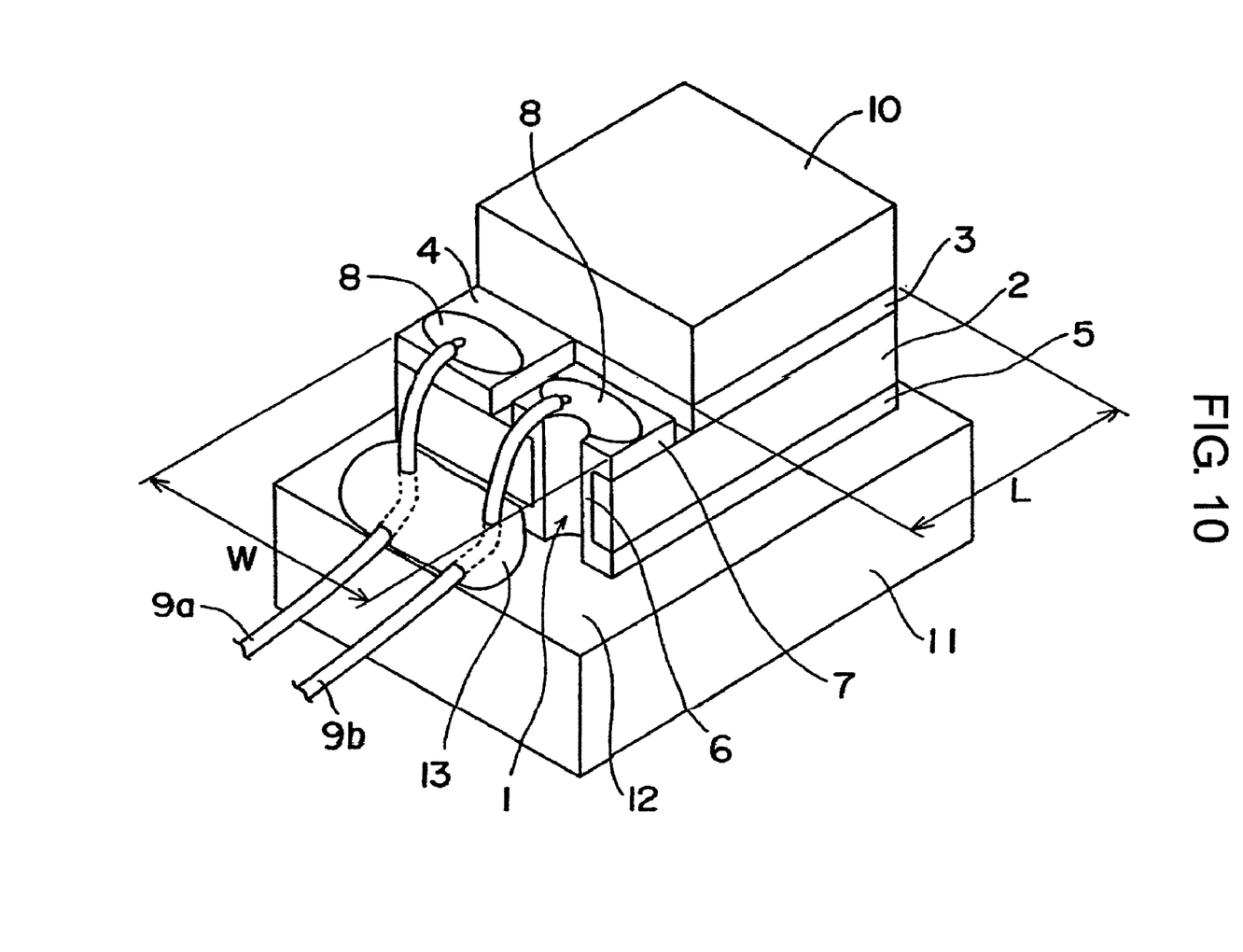
FIG. 10 is a schematic view of another embodiment of an ultrasonic transducer according to the invention.

FIG. 10 is a schematic view of another embodiment of the ultrasonic transducer, in which the acoustic absorbing layer 11 is extended beyond the rear side of the ceramic sheet piece 2, that is, the side having the retracted portion 1, to provide an extended portion and the first and second lead wires 9a, 9b are intermediately fixed onto the extended portion with adhesive 13.

In the case that the ultrasonic transducer is in the form illustrated in FIG. 10, the lead wires 9a, 9b are firmly attached to the ultrasonic transducer.

What is claimed is:

1. An ultrasonic transducer comprising a rectangular piezoelectric ceramic sheet piece which has a retracted portion on a side face, an upper electrode layer placed on an upper surface of the ceramic sheet piece, a first terminal electrode that is placed on the upper surface of the ceramic sheet piece and electrically connected to the upper electrode layer, a lower electrode layer placed on the lower surface of the ceramic sheet piece, an electro-conductive layer that is placed on the retracted side face and electrically connected to the lower electrode layer, a second terminal electrode that is placed on the upper surface of the ceramic sheet piece and is electrically connected to the electro-conductive layer, a first lead wire electrically connected to the first terminal electrode, a second lead wire electrically connected to the second terminal electrode, an acoustic matching layer placed on the upper electrode layer, and an acoustic absorbing layer placed on the surface of the lower electrode layer.

2. The ultrasonic transducer of claim 1, in which the acoustic absorbing layer is extended beyond the rear side of the ceramic sheet piece to provide an extended layer and the first and second lead wires are intermediately fixed onto the extended layer.

3. A process for manufacturing the ultrasonic transducer of claim 1 which comprises the steps of:
1) providing a piezoelectric ceramic sheet which has through-holes aligned on the sheet;
2) placing a lower electrode layer on a lower surface of the ceramic sheet around each of lower openings of the through-holes and placing an electro-conductive layer on an inner face of each of the through-holes;
3) placing a second terminal electrode on an upper surface of the ceramic sheet around each of upper openings of the through-holes, another electro-conductive layer on an inner face of each of the through-holes to electrically connect it to the electro-conductive layer placed in the through-holes in the step 2), an upper electrode layer on the upper surface of the ceramic sheet in an area facing the lower electrode layer, and a first terminal electrode on the upper surface of the ceramic sheet in which the first terminal electrode is electrically connected to the upper electrode layer under such condition that both of the upper electrode layer and the first terminal electrode are electrically kept off the second terminal electrode;
4) placing an acoustic matching layer on the upper electrode layer;
5) placing an acoustic absorbing layer on the lower electrode layer;
6) cutting the ceramic sheet at least subjected to the steps 2) and 3 in such manner that the ceramic sheet is divided along an imaginary line connecting the through-holes and each of divided portions has an upper electrode, an upper terminal electrode, a lower electrode layer and a lower terminal electrode, and
7) attaching a first lead wire to the first terminal electrode and a second lead wire to the second terminal electrode, in which the step 3) can be performed in advance of the step 2); the step 5) can be performed in advance of the step 4); and the step 4) and the step 5) can be performed between the step 6) and the step 7).

4. The process of claim 3, in which the ceramic sheet provided in the step 1) is manufactured by first forming the through-holes by punching or drilling and then grinding both of the upper and lower surfaces of the ceramic sheet.

* * * * *